(12) United States Patent
Su et al.

(10) Patent No.: US 7,193,475 B2
(45) Date of Patent: Mar. 20, 2007

(54) SINGLE-ENDED INPUT TO DIFFERENTIAL OUTPUT LOW NOISE AMPLIFIER WITH A CASCODE TOPOLOGY

(75) Inventors: Jiong-Guang Su, Taipei (TW); Tsyr-Shyang Liou, Taipei (TW); Shyh-Chyi Wong, Taipei (TW)

(73) Assignee: Richwave Technology Corp., Taipei (TW)

( * ) Notice: Subject to any disclaimer, the term of this patent is extended or adjusted under 35 U.S.C. 154(b) by 127 days.

(21) Appl. No.: 11/124,094

(22) Filed: May 9, 2005

(65) Prior Publication Data

US 2006/0103468 A1 May 18, 2006

(30) Foreign Application Priority Data

Nov. 12, 2004 (TW) .............. 93134837 A

(51) Int. Cl.
*H03F 3/45* (2006.01)
(52) U.S. Cl. .............. 330/301; 330/302; 330/310
(58) Field of Classification Search ........ 330/301–302, 330/310–311; 333/25
See application file for complete search history.

(56) References Cited

U.S. PATENT DOCUMENTS

| 5,868,061 | A | * | 2/1999 | Hansen et al. ................. 92/71 |
| 6,094,108 | A | * | 7/2000 | Suematsu et al. ............. 333/25 |
| 6,122,532 | A | * | 9/2000 | Taylor ........................ 455/574 |
| 6,133,793 | A | * | 10/2000 | Lau et al. ................... 330/302 |
| 6,850,120 | B2 | * | 2/2005 | Heima et al. ............... 330/311 |
| 7,035,616 | B2 | * | 4/2006 | Reynolds .................... 455/326 |
| 7,053,718 | B2 | * | 5/2006 | Dupuis et al. .............. 330/311 |

\* cited by examiner

*Primary Examiner*—Robert Pascal
*Assistant Examiner*—Hieu Nguyen
(74) *Attorney, Agent, or Firm*—Troxell Law Office PLLC

(57) ABSTRACT

A single-ended input to differential output LNA with a cascode topology of the present invention overcomes a much greater consumption of current and area for the single-ended input to differential output LNA of the prior art. The LNA needs to supply an operating bias for each transistor. The LNA has a few transistors, a few capacitive impedances, and a few inductive impedances. The main objective of the present invention not only reduces costs and conserves area and current consumption, but also has a much higher linearity and gain under the same current consumption when compare to the prior art.

16 Claims, 6 Drawing Sheets

SINGLE-ENDED INPUT TO DIFFERENTIAL OUTPUT LOW NOISE AMPLIFIER WITH A CASCODE TOPOLOGY

BACKGROUND OF THE INVENTION

1. Field of the Invention

The present invention relates to a single-ended input to differential output low noise amplifier with a cascode topology, and more particularly to an architecture and concept with a cascode topology.

2. Description of Related Art

FIG. 1 shows a function block diagram of a front-end receiver of the prior RF system. An LNA 14 is one part of the receiver in the communication system. The LNA 14 amplifies a received signal and dominates the noise figure of the receiver. After an antenna 11 receives a high frequency signal, the signal is transferred to a duplexer 12, filtering with a first filter 131, amplifying with a low noise amplifier (LNA) 14 and filtering with a second filter 132, subsequently mixing with a mixer 15 and ongoing continuing the procedure of the signal processing.

Reference is made to FIG. 1. In general, the LNA 14 is a type of single-ended input to single-ended output. Accordingly, the mixer 15 located behind the LNA 14 must be a type of single input, so a common mode noise of the receiver and an output signal that feeds through from an oscillator 16 to the mixer 15 do not effectively decrease. Nonetheless, a LNA with differential output can resolve the above problems.

A differential pair with differential input and output is usually used in the differential output LNAs. A balun must be added in front of the differential input to differential output amplifier, for converting an output signal of the antenna 11 to a differential output signal. This matter has some drawbacks. The balun is an added cost, and the noise figure of the whole front-end receiver is therefore increased by the balun.

FIG. 2 shows a circuit diagram of a single-ended input to differential output LNA with a passive transformer. A transformer T1 is made of wire-wrap of IC metal. The T1 is electrically connected a first transistor M1 and a second transistor M2 of a differential pair for converting single-ended signal to differential signal. At the same time, FIG. 2 has a DC current source $I_S$ and an output matching impedance $Z_{L1}$ and $Z_{L2}$. This matter has some drawbacks. The transformer takes up die area, the current of $I_S$ must be the sum of the currents of two transistors, and the noise figure of the LNA is increased.

FIG. 3 shows a circuit diagram of a single-ended input to a differential output LNA under one terminal connected the ground. Although cost and area of the transformer T1 are reduced, the complexity of design of the LNA increases when the common mode point is unbalanced for operating at high frequencies. Likewise, the current of $I_S$ still is the sum of the currents of two transistors.

SUMMARY OF THE INVENTION

The main objective of the present invention is to reduce current and area for the single-ended input to differential output LNA of the prior art.

Accordingly, the present invention provides a single-ended input to differential output LNA with a cascode topology, in which the LNA needs to supply the operating bias for each transistor. The LNA comprises a first metal-oxide-semiconductor field effect transistor (MOSFET) and a second MOSFET, for amplifying a signal, the signal input/output by a gate terminal, a drain terminal and a source terminal of each the MOSFET.

A first capacitive impedance serves as a low impedance at high frequencies. One terminal thereof is electrically connected to the drain terminal of the first MOSFET; the other terminal thereof is electrically connected to the gate terminal of the second MOSFET. A first inductive impedance serves as a high impedance at high frequencies. One terminal thereof is electrically connected to the drain terminal of the first MOSFET; the other terminal thereof is electrically connected to the source terminal of the second MOSFET.

A second inductive impedance serves as a high impedance at high frequencies. One terminal thereof is electrically connected to the drain terminal of the second MOSFET; the other terminal thereof is electrically connected to a first voltage source. A second capacitive impedance serves as a low impedance at high frequencies. One terminal thereof is electrically connected to the source terminal of the second MOSFET; the other terminal thereof is electrically connected to the ground. A third inductive impedance performs part of impedance matching at high frequencies. One terminal thereof is electrically connected to the source terminal of the first MOSFET; the other terminal thereof is electrically connected to a second voltage source.

A high frequency signal is input into a gate terminal of the first MOSFET, and an amplified signal of a differential pair is output from the drain terminal of the first MOSFET and the second MOSFET. The present invention can alternate a bipolar junction transistor (BJT) with the MOSFET.

The main objective of the single-ended input to differential output LNA with cascode topology of the present invention is cost efficient, and conserves area and current consumption. It also has much higher linearity and gain under the same current consumption when compare to the prior art.

BRIEF DESCRIPTION OF THE DRAWINGS

The various objectives and advantages of the present invention will be more readily understood from the following detailed description when read in conjunction with the appended drawing, in which.

DETAILED DESCRIPTION OF THE PREFERRED EMBODIMENTS

Figure 1:
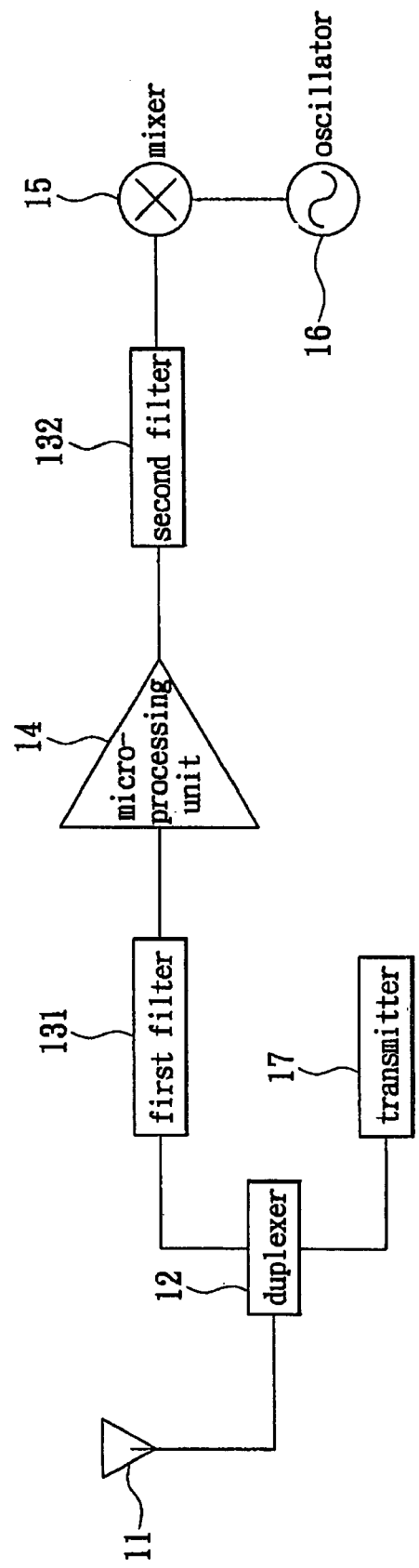
FIG. 1 is a function block diagram of a front-end receiver of the prior RF system.
Figure 2:
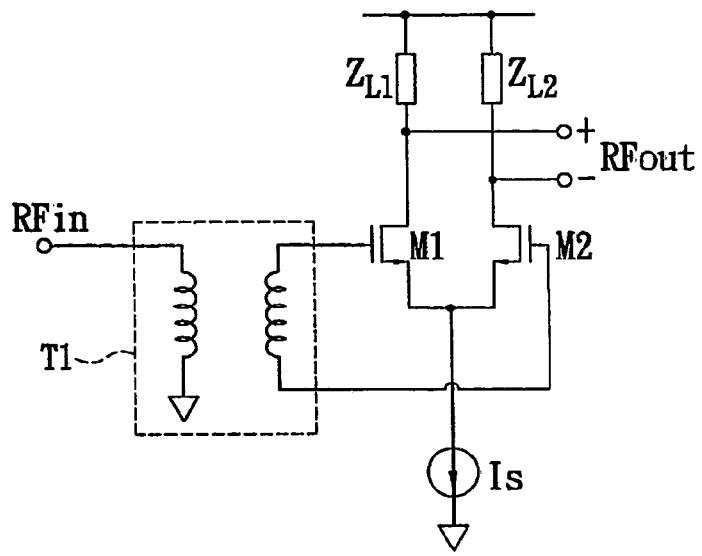
FIG. 2 is a circuit diagram of a single-ended input to differential output LNA with a passive transformer.
Figure 3:
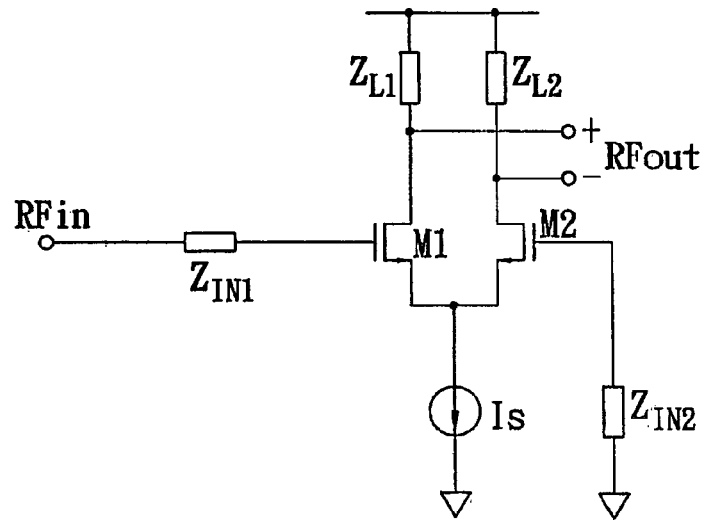
FIG. 3 is a circuit diagram of a single-ended input to differential output LNA under one terminal connected the ground.
Figure 4:
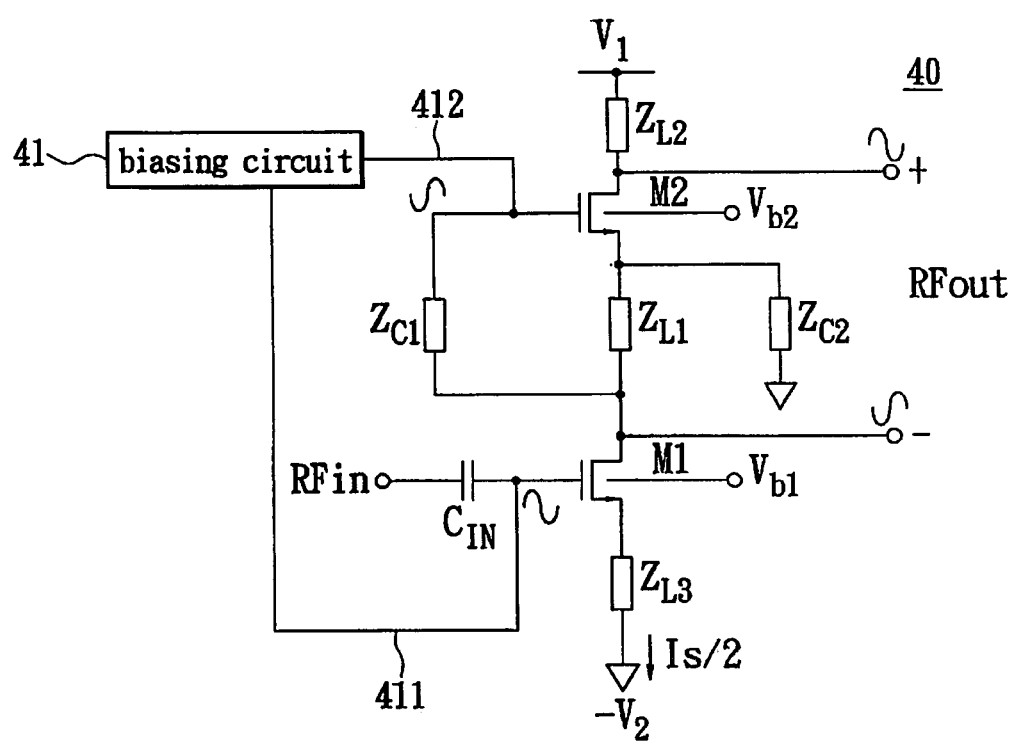
FIG. 4 is a circuit diagram of a single-ended input to differential output LNA with a cascode topology of the present invention.

FIG. 4 shows a circuit diagram of a single-ended input to differential output LNA with a cascode topology of the present invention. The most important difference between the present invention and the prior art is the cascode topology. The present invention doesn't have a transformer occupying a lot of area, and the present invention only consumes half the current consumed by the prior art under the same supply voltage. The operating principle and technical feature of the present invention will be described in greater detail in the following.

Reference is made to FIG. 4. A first N-type MOSFET M1 and a second N-type MOSFET M2 amplify a signal. The signal is input/output by a gate terminal, a drain terminal and a source terminal of each N-type MOSFET.

A first capacitive impedance $Z_{C1}$ serves as a low impedance at high frequencies. One terminal thereof is electrically connected to the drain terminal of the first N-type MOSFET M1; the other terminal thereof is electrically connected to the gate terminal of the second N-type MOSFET M2. A first inductive impedance $Z_{L1}$ serves as a high impedance at high frequencies. One terminal thereof is electrically connected to the drain terminal of the first N-type MOSFET M1; the other terminal thereof is electrically connected to the source terminal of the second N-type MOSFET M2.

A second inductive impedance $Z_{C2}$ serves as a high impedance at high frequencies. One terminal thereof is electrically connected to the drain terminal of the second N-type MOSFET M2; the other terminal thereof is electrically connected to a positive voltage terminal of a first voltage source V1. A second capacitive impedance $Z_{C2}$ serves as a low impedance at high frequencies. One terminal thereof is electrically connected to the source terminal of the second N-type MOSFET M2; the other terminal thereof is electrically connected to the ground. A third inductive impedance $Z_{L3}$ performs part of impedance matching at high frequencies. One terminal thereof is electrically connected to the source terminal of the first N-type MOSFET M1; the other terminal thereof is electrically connected to a negative voltage terminal of a second voltage source V2. A high frequency signal is input into a gate terminal of the first MOSFET M1, and an amplified signal is then output with a differential pair by the drain terminal of the first MOSFET M1 and the second MOSFET M2.

For providing an operating bias for the LNA 40 of the present invention, further having a biasing circuit 41, the biasing circuit 41 provides a first biasing circuit 411 electrically connected to the gate terminal of the first N-type MOSFET M1 and provides a second biasing circuit 412 electrically connected to the gate terminal of the second N-type MOSFET M2. Moreover, a DC blocking capacitor $C_{IN}$ is electrically connected to the gate terminal of the first N-type MOSFET M1, for a high frequency accessing of the first N-type NOSFET M1. Nonetheless, the operating bias of the first N-type MOSFET is not changed by other impedances of an outside circuit.

A signal by the first N-type MOSFET M1 is amplified and used as a common-source amplifier after a high frequency signal is input into a signal input terminal $RF_{IN}$ at high frequencies. The amplified signal then is transferred to a negative terminal of a differential pair output $RF_{OUT}$. Because of the characteristic of the MOSFET itself, a phase difference of the signal is about 180 degrees between the gate terminal and the drain terminal of the first N-type MOSFET M1.

Because the signal at the drain of the first N-type MOSFET M1 couples to the gate terminal of the second N-type MOSFET M2 by the first capacitive impedance $Z_{C1}$, the signal at the gate terminal of the second N-type MOSFET M2 and the signal at the drain terminal of the first N-type MOSFET M1 have the same phase. The first capacitive impedance $Z_{C1}$ approximates a low impedance such as a "short" at high frequencies. Still, the first inductive impedance $Z_{L1}$ at the drain terminal of the first N-type MOSFET M1 prevents the high frequency signal from coupling to the source terminal of the second N-type MOSFET M2 and eventually to the drain terminal of the second N-type MOSFET M2 through its channel, thereby corrupting the amplified high frequency signal by the second N-type MOSFET M2. Accordingly, the first inductive impedance $Z_{L1}$ approximates a high impedance at high frequencies.

As in the first N-type MOSFET M1, the phase difference of signal is approximately 180 degrees between the gate terminal and the drain terminal of the second N-type MOSFET M2. After amplifying a signal by the second N-type MOSFET M2 used as a common-source amplifier, the amplified signal is transferred to a positive terminal of the differential output $RF_{OUT}$, as shown in FIG. 4. The positive terminal and the negative terminal of the differential output $RF_{OUT}$ has a differential signal with a phase difference of approximately 180 degrees.

Accordingly, the second inductive impedance $Z_{L2}$ approximates a high impedance at high frequencies for preventing the high frequency signal loss through the first voltage source V1 that has a positive voltage. Moreover, so as to satisfy the second N-type MOSFET used as a common source amplifier, the source terminal of the second N-type MOSFET must electrically connect to the ground by passing through the second capacitive impedance $Z_{C2}$. The second capacitive impedance $Z_{C2}$ approximates a low impedance such as a "short" at high frequencies. Moreover, the source terminal of the first N-type MOSFET M1 electrically connects to a negative voltage V2 by passing through the third inductive impedance $Z_{L3}$. The third inductive impedance $Z_{L3}$ is for part of impedance matching.

Reference is made to FIG. 4. In the single-ended input to differential output LNA 40 with a cascode topology of the present invention, a first body voltage $V_{b1}$ within the first N-type MOSFET M1 and a second body voltage $V_{b2}$ within the second N-type MOSFET M2 can be connected to other voltage terminals to satisfy a demand of circuit design. Moreover, the bias and the physical layout size of the first N-type MOSFET M1 and the second N-type MOSFET M2 need not be equal, and can be changed to adjust a required linearity and gain of the LNA 40 of the present invention.

Figure 5:
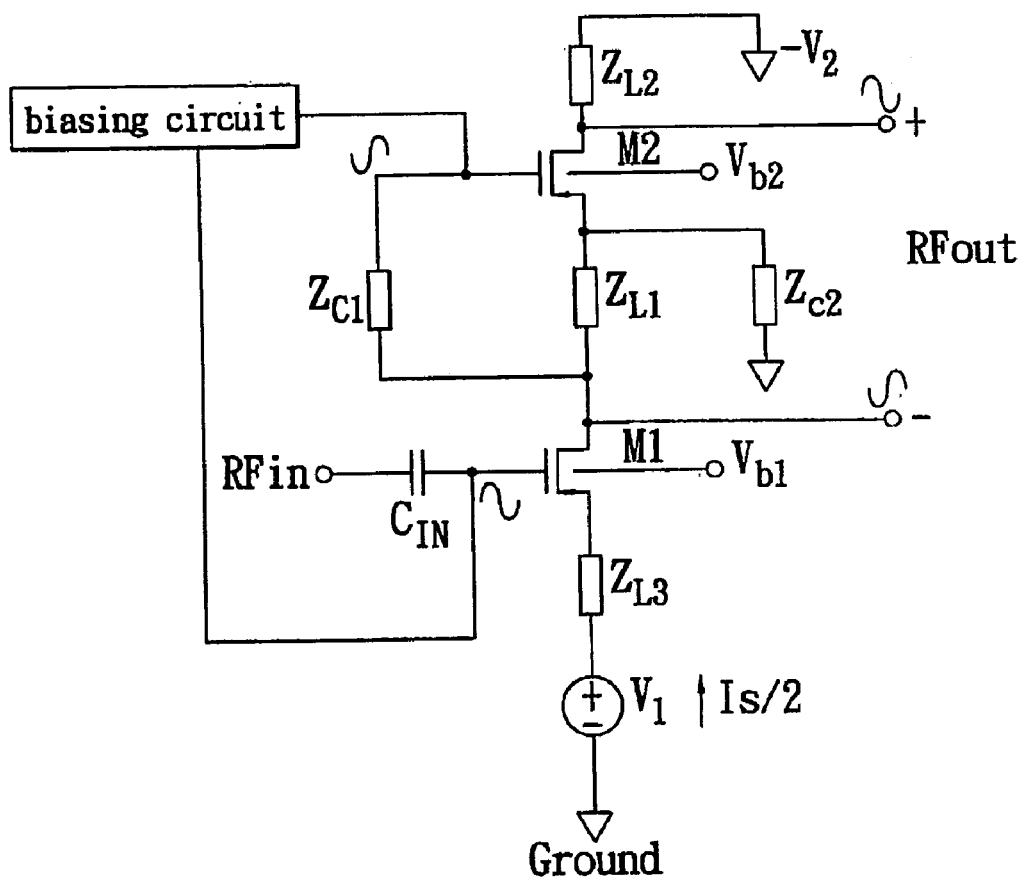
FIG. 5 is a second embodiment of the present invention.

Reference is made to FIG. 5 and FIG. 4. FIG. 5 shows a second embodiment of the present invention. The M1 and the M2 of the N-type MOSFET of FIG. 4 are replaced by the M1 and the M2 of the P-type MOSFET of FIG. 5. The operating bias of the M1 and the M2 of FIG. 5 provides a negative voltage for the gate to source terminals, a positive voltage for the source terminal, and a negative voltage for the drain terminal.

Figure 6:
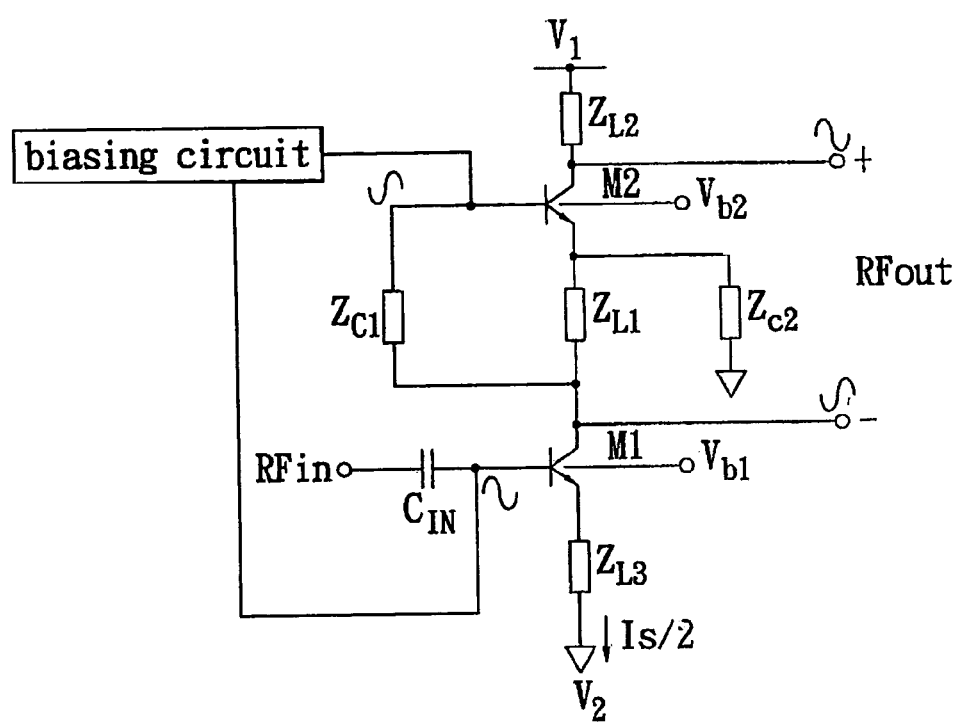
FIG. 6 is a third embodiment of the present invention.

Reference is made to FIG. 6 and FIG. 4. FIG. 6 shows a third embodiment of the present invention. The M1 and the M2 of the N-type MOSFET of FIG. 4 are replaced by the M1 and the M2 of a NPN-type BJT of FIG. 6. The gate terminal, the source terminal and the drain terminal of the M1 and the M2 of FIG. 4 are replaced by a base terminal, an emitter terminal and a collector terminal of an NPN-type BJT of FIG. 6.

Figure 7:
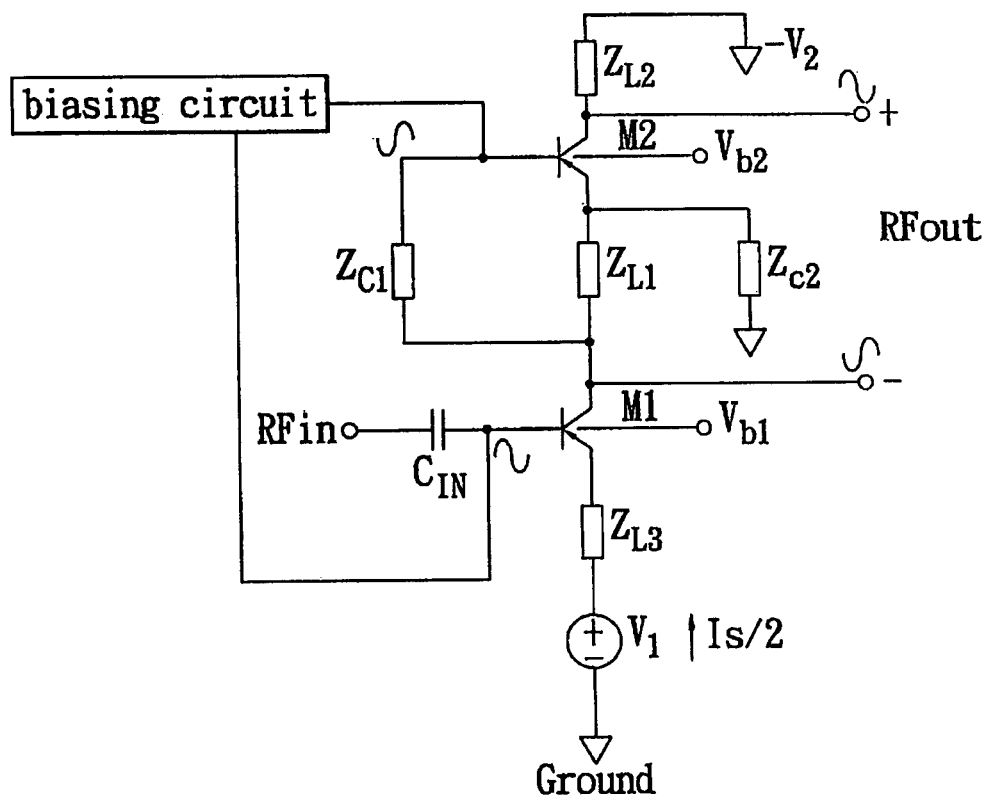
FIG. 7 is a fourth embodiment of the present invention.

Reference is made to FIG. 7 and FIG. 4. FIG. 7 shows a third embodiment of the present invention. Accordingly, the M1 and the M2 of the N-type MOSFET of FIG. 4 are replaced by the M1 and the M2 of a PNP-type BJT of FIG. 6. The gate terminal, the source terminal and the drain terminal of the M1 and the M2 of FIG. 4 are replaced by a base terminal, an emitter terminal and a collector terminal of a PNP-type BJT of FIG. 7. The operating bias of the M1 and the M2 of FIG. 7 provides a negative voltage for the base to emitter terminals, a positive voltage for emitter terminal, and a negative voltage for a collector terminal.

The single-ended input to differential output LNA 40 with cascode topology of the present invention not only reduces cost and conserves area and current consumption but also has a much higher linearity and gain under the same current consumption when compare to the prior art.

Although the present invention has been described with reference to the preferred embodiments thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A single-ended input to differential output LNA with a cascode topology, wherein said LNA needs to supply an operating bias for each transistor, said LNA comprising:
    a first metal-oxide-semiconductor field effect transistor (MOSFET) and a second MOSFET, for amplifying a signal, the signal being input by and output from a gate terminal, a drain terminal and a source terminal of each said MOSFET;
    a first capacitive impedance, for serving as a low impedance at high frequencies, wherein one terminal thereof is electrically connected to the drain terminal of said first MOSFET, and another terminal thereof is electrically connected to the gate terminal of said second MOSFET;
    a first inductive impedance, for serving as a high impedance at high frequencies, wherein one terminal thereof is electrically connected to the drain terminal of said first MOSFET and another terminal thereof is electrically connected to the source terminal of said second MOSFET;
    a second inductive impedance, for serving as a high impedance at high frequencies, wherein one terminal thereof is electrically connected to the drain terminal of said second MOSFET and another terminal thereof is electrically connected to a first voltage source;
    a second capacitive impedance, for serving as a low impedance at high frequencies, wherein one terminal thereof is electrically connected to the source terminal of said second MOSFET and another terminal thereof is electrically connected to the ground; and
    a third inductive impedance, for part of impedance matching at high frequencies, wherein one terminal thereof is electrically connected to the source terminal of said first MOSFET and another terminal thereof is electrically connected to a second voltage source;
    whereby a high frequency signal is input into the gate terminal of said first MOSFET and then an amplified differential signal is output from the drain terminal of said first MOSFET and said second MOSFET.

2. The single-ended input to differential output LNA with a cascode topology as claimed in claim 1, wherein said first MOSFET and said second MOSFET are N-type MOSFETs.

3. The single-ended input to differential output LNA with a cascode topology as claimed in claim 1, wherein said first MOSFET and said second MOSFET are P-type MOSFETs.

4. The single-ended input to differential output LNA with a cascode topology as claimed in claim 1, further comprising a bias circuit electrically connected to the gate terminal of said first MOSFET and said second MOSFET, respectively.

5. The single-ended input to differential output LNA with a cascode topology as claimed in claim 1, further comprising a DC blocking capacitor electrically connected to the gate terminal of said first MOSFET, for performing a high frequency accessing of said first MOSFET, wherein the operating bias of said first MOSFET is not changed by another impedance of an outside circuit.

6. The single-ended input to differential output LNA with a cascode topology as claimed in claim 1, wherein a body voltage of said first MOSFET and said second MOSFET are used as a voltage to satisfy a demand of circuit design.

7. The single-ended input to differential output LNA with a cascode topology as claimed in claim 1, wherein the physical layout size of said first MOSFET and said second MOSFET is changed to adjust a required linearity and gain of said LNA.

8. The single-ended input to differential output LNA with a cascode topology as claimed in claim 1, wherein the bias of said first MOSFET and said second MOSFET is changed to adjust a required linearity and gain of said LNA.

9. A single-ended input to differential output LNA with a cascode topology, wherein said LNA supplies an operating bias for each transistor, said LNA comprising:
    a first bipolar junction transistor (BJT) and a second BJT, for amplifying a signal, the signal input into and output by a base terminal, a collector terminal and an emitter terminal of each said BJT;
    a first capacitive impedance, for serving as a low impedance at high frequencies, wherein one terminal thereof is electrically connected to the collector terminal of said first BJT and another terminal thereof is electrically connected to the base terminal of said second BJT;
    a first inductive impedance, for serving as a high impedance at high frequencies, wherein one terminal thereof is electrically connected to the collector terminal of said first BJT and another terminal thereof is electrically connected to the emitter terminal of said second BJT;
    a second inductive impedance, for serving as a high impedance at high frequencies, wherein one terminal thereof is electrically connected to the collector terminal of said second BJT and another terminal thereof is electrically connected to a first voltage source;
    a second capacitive impedance, for serving as a low impedance at high frequencies, wherein one terminal thereof is electrically connected to the emitter terminal of said second BJT and another terminal thereof is electrically connected to a ground; and
    a third inductive impedance, for part of impedance matching at high frequencies, wherein one terminal thereof is electrically connected to the emitter terminal of said first BJT and another terminal thereof is electrically connected to a second voltage source;
    whereby a high frequency signal is input into the base terminal of said first BJT and then an amplified differential signal is output from the collector terminal of said first BJT and said second BJT.

10. The single-ended input to differential output LNA with a cascode topology as claimed in claim 1, wherein said first BJT and said second BJT are NPN-type BJTs.

11. The single-ended input to differential output LNA with a cascode topology as claimed in claim 1, wherein said first BJT and said second BJT are PNP-type BJTs.

12. The single-ended input to differential output LNA with a cascode topology as claimed in claim 1, further comprising a bias circuit electrically connected to the base terminal of said first BJT and said second BJT, respectively.

13. The single-ended input to differential output LNA with a cascode topology as claimed in claim 1, further comprising a DC blocking capacitor electrically connected to the base terminal of said first BJT, for performing a high frequency accessing of said first BJT, wherein the operating bias of said first BJT is not changed by another impedance of an outside circuit.

14. The single-ended input to differential output LNA with a cascode topology as claimed in claim 1, wherein a substrate voltage of said first BJT and said second BJT is used as a voltage to satisfy a circuit design requirement.

15. The single-ended input to differential output LNA with a cascode topology as claimed in claim 1, wherein the physical layout size of said first BJT and said second BJT is changed to adjust a required linearity and gain of said LNA.

16. The single-ended input to differential output LNA with a cascode topology as claimed in claim 1, wherein the bias of said first BJT and said second BJT is changed to adjust a required linearity and gain of said LNA.

* * * * *